United States Patent
Rome

(10) Patent No.: US 9,181,459 B2
(45) Date of Patent: *Nov. 10, 2015

(54) COMPONENT CARRIER REEL SPLICING TAPE

(75) Inventor: Patrick Rome, El Paso, TX (US)

(73) Assignee: ElectroReel Components, LLC, El Paso, TX (US)

(*) Notice: Subject to any disclaimer, the term of this patent is extended or adjusted under 35 U.S.C. 154(b) by 351 days.

This patent is subject to a terminal disclaimer.

(21) Appl. No.: 13/012,863

(22) Filed: Jan. 25, 2011

(65) Prior Publication Data

US 2012/0066881 A1 Mar. 22, 2012

Related U.S. Application Data

(60) Provisional application No. 61/383,616, filed on Sep. 16, 2010.

(51) Int. Cl.
*C09J 7/02* (2006.01)

(52) U.S. Cl.
CPC .............. *C09J 7/0264* (2013.01); *C09J 7/0232* (2013.01); *C09J 2201/20* (2013.01); *C09J 2203/342* (2013.01); *Y10T 29/49817* (2015.01); *Y10T 428/14* (2015.01); *Y10T 428/149* (2015.01)

(58) Field of Classification Search
CPC ....... B65H 21/00; B65H 21/92; C09J 7/0232; C09J 7/0264; C09J 2203/342; C09J 2201/20; Y10T 29/49817; Y10T 428/14; Y10T 428/149
See application file for complete search history.

(56) References Cited

U.S. PATENT DOCUMENTS

| | | | | |
|---|---|---|---|---|
| 2,964,587 A | * | 12/1960 | Minot | 174/117 A |
| 3,424,644 A | | 1/1969 | Nakagome | |
| 4,247,582 A | * | 1/1981 | Hanke | 428/43 |
| 4,446,183 A | * | 5/1984 | Savagian | 428/42.3 |
| 5,643,401 A | | 7/1997 | Schulze-Kahlayss et al. | |
| 5,692,699 A | | 12/1997 | Weirauch et al. | |

(Continued)

FOREIGN PATENT DOCUMENTS

| JP | 2003-246510 A | 9/2003 |
|---|---|---|
| JP | 2010-189008 A | 9/2010 |

OTHER PUBLICATIONS

International Search Report for PCT/US2011/022314 dated May 8, 2013.

*Primary Examiner* — Patricia L Nordmeyer
(74) *Attorney, Agent, or Firm* — Kevin Soules; Luis M. Ortiz; Kermit D. Lopez

(57) ABSTRACT

A splicing tape for accurately aligning and joining spliced component carrier reels is disclosed. The flexible splice tape allows the components to remain aligned and picked from a component carrier reel without interruption at the union of a first and second reel. The splice tape with an optional stiffening strip provides a flexible, yet strong connection to prevent back and forth, axial and lateral movement between spliced reels. The detection of the disclosed splice tape facilitates elimination of incorrect and mismatched components during splicing. The splice tape comprises a plastic-type material coated on one side with a pressure-sensitive adhesive composition. A protective paper covers the adhesive composition. The splice tape and protective paper are divided into sections using a staggered slit arrangement. The staggered slit arrangement aids in proper alignment and adhesion of the splice tape to component carrier reels.

10 Claims, 14 Drawing Sheets

(56) References Cited

U.S. PATENT DOCUMENTS

| | | |
|---|---|---|
| 5,916,651 A | 6/1999 | Wienberg et al. |
| 5,996,927 A | 12/1999 | Weirauch et al. |
| 6,428,888 B1 | 8/2002 | Kato |
| 6,649,239 B2 * | 11/2003 | Donahue ............... 428/40.1 |
| RE38,356 E | 12/2003 | Weirauch et al. |
| 6,916,394 B2 * | 7/2005 | Sumida et al. ............. 156/157 |
| 7,152,825 B2 | 12/2006 | Nootbaar |
| 7,476,429 B2 | 1/2009 | Bean et al. |
| 2002/0056784 A1 | 5/2002 | Davies et al. |
| 2004/0045658 A1 | 3/2004 | Bean et al. |
| 2008/0087370 A1 | 4/2008 | Manteufel |
| 2009/0117310 A1 * | 5/2009 | Ellringmann et al. ....... 428/42.2 |
| 2014/0220285 A1 * | 8/2014 | Rome ..................... 428/41.7 |

* cited by examiner

COMPONENT CARRIER REEL SPLICING TAPE

CROSS REFERENCE TO RELATED APPLICATIONS

This patent application claims the priority and benefit under 35 U.S.C. §119(e) of U.S. Provisional Patent Application Ser. No. 61/383,616 filed on Sep. 16, 2010, and entitled "System and Method for Accurately Aligning Splicing Reels Using Antistatic Splicing Tape," which is incorporated herein by reference in its entirety.

TECHNICAL HELD

The disclosed embodiments relate to components and component carrier reels. The disclosed embodiments further relate to techniques for accurately splicing, aligning, and connecting component carrier reels. The disclosed embodiments also relate to accurate component placement from the properly spliced component carrier reels into various devices.

BACKGROUND OF THE INVENTION

As miniaturization of components and circuit boards advance, smaller components require precise reel-to-reel interface in order to avoid costly integration problems. A missing, wrong, or misplaced component occurring at a red changeover connection could result in loss of an entire run of finished circuit boards, or other assembled products. A significant and expensive product loss, however, may result following a splicing error. Product loss entails a difficult re-work of devices, scrap of the circuit board assembly, for example, or even more catastrophic, a product failure in the field.

Proposed solutions include using some form of alignment tool on the alignment or splice tape, such as box-like teeth of a certain length and width, holes for receiving sprockets or knobs, color-coding spliced motion picture film. These methods are problematic because alignment tools incorporated on tape itself makes it difficult to accurately align spliced reels in an efficient manner. Production in manufacturing lines often interrupts when alignment errors in reel splicing occur. Further, previous proposed solutions do not maintain a strong, yet flexible joint when feeding the component carrier reels through machines for insertion of mechanical or electrical components. The static shock-inducing plastic carrier of previous designs is further problematic in previous splicing tapes. Universal use of a single splice tape design could apply to numerous sizes, shapes, and widths of component carrier reels.

Therefore, a need exists for a method to error proof reel splicing to prevent costly interruptions of manufacturing lines. Using an improved, cost-efficient splice tape to accurately align and connect component carrier reels will result in accurate component placement into various devices from properly aligned component carrier reels.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is therefore an object of the disclosed embodiments to enhance splice tape reliability by reducing improper placement of components that may shift pick location near a reel splice interconnection.

It is another object of the disclosed embodiments to eliminate or reduce waste sections of static shock-inducing alignment and handling portions of splice designs, and the disposal of such waste at the point of use, while maintaining ease of use with a single placement of splice tape to achieve full assembly of spliced reels.

It is an object of the disclosed embodiments to provide a means of detecting the joint between the first and second spliced reels through visual blocking of the component's reel feeder holes, or use of inductive sensible materials incorporated in the splice.

The above and other aspects can be achieved as is now described. A splicing tape for accurately aligning and joining spliced component carrier reels is disclosed. The flexible splice tape allows the components to remain aligned and picked from a component carrier reel without interruption at the union of a first and second reel. The splice tape with an optional stiffening strip provides a flexible, yet strong connection to prevent back and forth, axial and lateral movement between spliced reels. The detection of the disclosed splice tape facilitates elimination of incorrect and mismatched components during splicing. The splice tape comprises a plastic-type material coated on one side with a pressure-sensitive adhesive composition. A protective paper covers the adhesive composition. The splice tape and protective paper are divided into sections using a staggered slit arrangement. The staggered slit arrangement aids in proper alignment and adhesion of the splice tape to component carrier reels.

A splice tape is disclosed that comprises a tape material, a protective paper covering an adhesive composition applied to one side of said tape material wherein said adhesive composition adheres said tape material to a component carrier reel joint, and a staggered slit arrangement cut into said tape material and said protective paper to form staggered sections between said tape material and said protective paper in order to easily remove sections of said protection paper to expose said adhesive composition for proper alignment and adhesion of said tape material to said component carrier reel joint. The component carrier reel joint comprises a first component carrier reel laterally aligned with a second component carrier reel. The tape material can be made of a thin plastic material, such as, for example, polyester, or other type of polymeric material. A stiffening strip made of brass, copper, or bronze, for example, can be attached to said tape material to prevent said component carrier reel joint from moving either axially or laterally when said splice tape is adhered to said component carrier reel joint. The metalized stiffening strip can also be used for inductive or visual sensing of spliced component carrier reels to determine splice location for a new feed of components.

The staggered slit arrangement in said tape material creates a first tape section, a second tape section, and third tape section. The staggered slit arrangement in said protective paper creates a first protective paper section, a second protective paper section, and third protective paper section. The first tape section adheres to an offset said first protective paper section, the second tape section adheres to an offset said second protective paper section, and the third tape section adheres to an offset said third protective paper section.

A method for splicing component carrier reels is disclosed. The method comprises providing a splice tape comprising a tape material, an adhesive composition coating one side of said tape material, and a protective paper covering said adhesive composition on said one side of said tape material; dividing said tape material and said protective paper into staggered, adhered sections of said tape material and said protective paper using a staggered slit arrangement; and adhering said splice tape to aligned first component carrier reel and second component carrier reel to form a strong and flexible joint between said first component carrier reel and second component carrier reel. A stiffening strip can also be attached to said tape material to prevent said component carrier reel joint from moving either axially or laterally when said splice tape is adhered to form a component carrier reel joint. The stiffening strip can also be used for inductive or visual sensing of spliced component carrier reels to determine splice location for a new feed of components. The staggered slit arrangement in said tape material creates a first tape section, a second tape section, and third tape section wherein notches between tape sections help initially connect said tape sections; said staggered slit arrangement in said protective paper creates a first protective paper section, a second protective paper section, and third protective paper section; and said first tape section adheres to an offset said first protective paper section, said second tape section adheres to an offset said second protective paper section, and said third tape section adheres to an offset said third protective paper section.

The method further comprises removing the first protective paper section from the first section of tape material to expose the adhesive composition on one side of the first section of tape material; aligning the first section of tape material with a top side of the first component carrier reel with a top side of a laterally-aligned the second component carrier reel; adhering the first section of tape material with the top side of said first component carrier reel with the top side of a laterally-aligned the second component carrier reel. The top side of the second component carrier reel comprises feeder holes and top cover tape covering component wells. The method further comprises removing the third protective paper section from the third section of tape material to expose the adhesive composition on one side of the third section of tape material; aligning the third section of tape material with a bottom side of the first component carrier reel with a bottom side of a laterally-aligned the second component carrier reel; adhering said third section of tape material with the bottom of the first component carrier reel with the bottom side of a laterally-aligned second component carrier reel. The bottom side of the first component carrier reel and the bottom side of the second component carrier reel comprises an underside of component wells.

The method further comprises removing said second section of tape material with adhered said second section of protective paper using a shearing motion at said staggered slits in said tape material and said protective paper to allow seamless feeding through machinery that accurately load components from spliced said first component carrier reel and said second component carrier reel into a device. An alignment fixture can be used to align feeder holes on said first and second component carrier reels, wherein said alignment fixture does not interfere with adhering said splice tape to said first and second component carrier reels to form a joint between said first and second component carrier reels. To aid in further proper alignment, the first component carrier reel and said second component carrier reel can be trimmed using a mandrel attached to scissors to align said first component carrier reel with said second component carrier reel.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

The embodiments now will be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
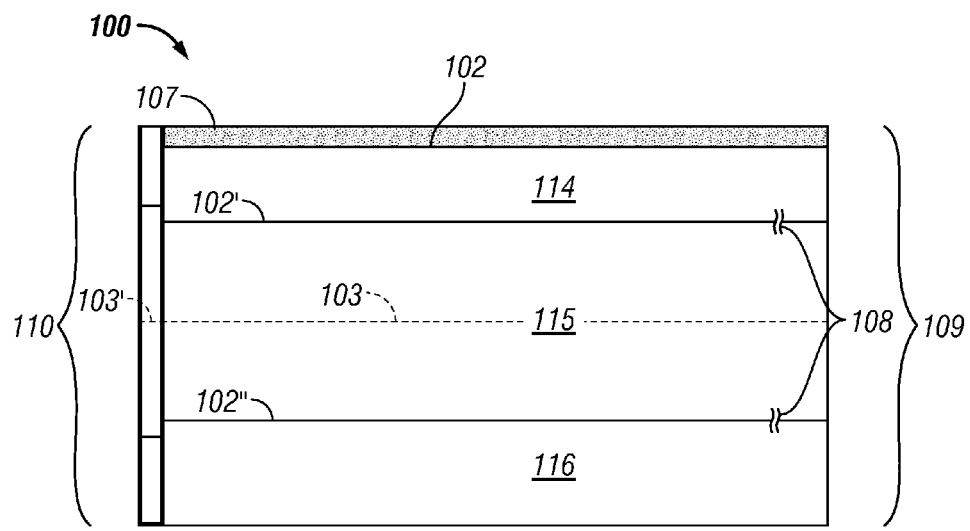
FIG. 1A illustrates a plan view of a first side of a splice tape, in accordance with the disclosed embodiments.

FIG. 1A illustrates a first side, or "tape side", of the splice tape 100 for aligning and connecting component carrier reels, in accordance with the disclosed embodiments. Component carrier reels can be aligned and connected utilizing a thin film splice tape 100 comprising polyester, or other plastic, polymeric, or flexible material, of any color or design. The spliced joint is strong, yet flexible to allow added components to be aligned in the reel without interruption at the union of first and second component carrier reels. The splice tape 100 can be divided using slits 102, 102', 102" between the different sections 114, 115, 116, 107, respectively comprising the tape side 109. The divided sections 114, 115, 116, 107 either adhere to certain portions of a component carrier reel joint, while others are removed, as will be further described herein. The splice tape 100 is generally folded 103 in the second tape section 115 when adhering it to component carrier reels. The edge of the protective paper 110 slightly extends from a first edge of the splice tape 100. The splice tape 100 eliminates the static shock-inducing plastic carrier of previous red connecting splice designs.

The splice tape 100 may have a stiffening material section 107 to prevent the spliced component carrier reels from moving back and forth, either axially or laterally. The inclusion of a stiffening strip 107 on the splice tape 100 depends on the size of the component carrier reel. Smaller component carrier reels, such as, for example, 4 mm reels, do not need an added stiffening strip to effectively secure the joint on the top tape sprocket feed hole side between component carrier reels as in the location of 107 above the component carrier feed holes. Alternatively, the stiffening strip can be attached to the underside of component carrier splicing tape, as illustrated, for example, in FIG. 23. The stiffening material section 107 can be comprised of metal or any other type of stiffening material that is either incorporated into the tape itself, or added as another section of the splice tape. The incorporated metal material, such as, for example, brass, copper, or bronze, can serve as a stiffening strip 107 for either inductive sensing or visual sensing of the spliced component carrier reels to determine splice location for a new feed of components. The stiffening strip 107 may also serve as a means of detecting the joint between the first and second spliced component carrier reels through visual blocking of the component's reel holes, or use of inductive sensible materials incorporated in the splice. The stiffening and inductive sensing metal could be incorporated onto the component carrier side of the component carrier reel.

The tape side 109 of the splice tape 100 may also have small notches 108, or indentions or nicks, between tape sections 114, 115, 116, 107 to aid in holding these sections together when the splice tape 100 is applied to a joint between component carrier reels. It is important to note that these notches 108 do not serve to align or attach the splice tape 100 with the component carrier reel, but rather lends further support and initial connectivity between tape sections 114, 115, 116, 107 of the splice tape 100.

Figure 1B:
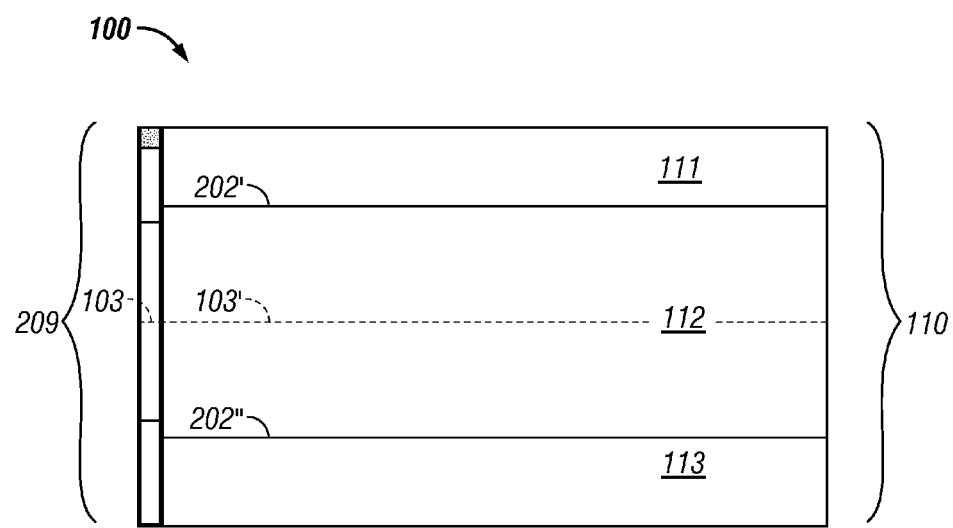
FIG. 1B illustrates a plan view of a second side of a splice tape, in accordance with the disclosed embodiments.

FIG. 1B illustrates a second side, or "protective paper side", of the splice tape 100, in accordance with the disclosed embodiments. The protective paper side of the splice tape 100 comprises a protective paper 110 that adheres to the tape side that is covered with an adhesive composition 209. The protective paper 110 is used to help grip the splice tape 100 for proper application to component carrier reels. The protective paper 110 is later removed to expose the adhesive composition 209 on the tape. The adhesive composition 209 is used to secure the splice tape 100 to component carrier reels, thus connecting the reels for seamless feeding through machinery that loads components from the component carrier reels into various devices.

The protective paper 110 can include slits 202', 202" located in different locations to allow removal of the protective paper 110 covering certain tape sections 114, 115, 116, and 107 of the splice tape 100. The adhesive composition 209 covering a certain tape section 114, 115, 116, and 107 is then exposed for adhesion of the splice tape 100 onto the component carrier reels to form a strong, yet flexible joint. A fold line 103' helps guide proper folding of the splice tape 100 into position to form the joint between component carrier reels.

Figure 2A:
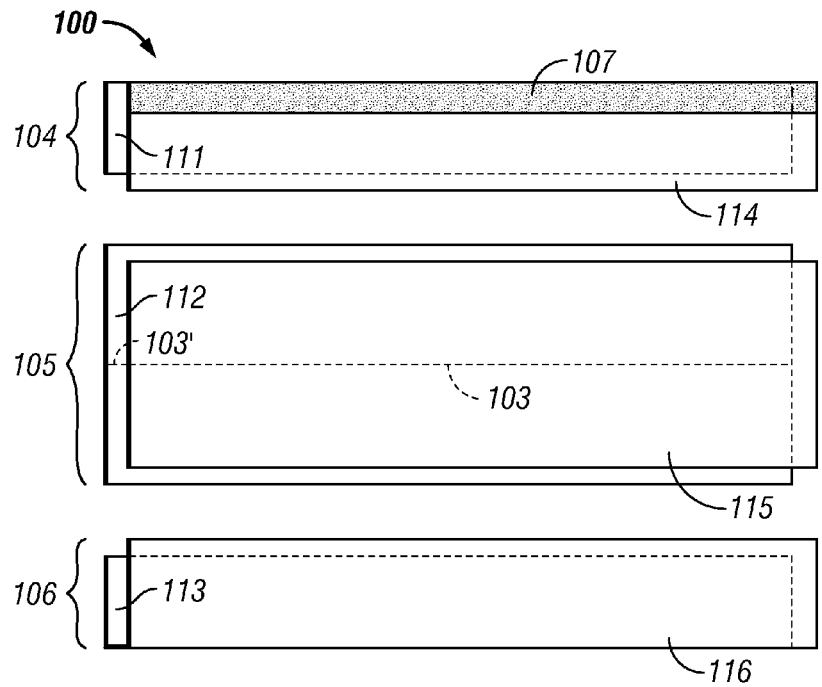
FIG. 2A illustrates an exploded plan view of a first side of a splice tape, in accordance with the disclosed embodiments.
Figure 2B:
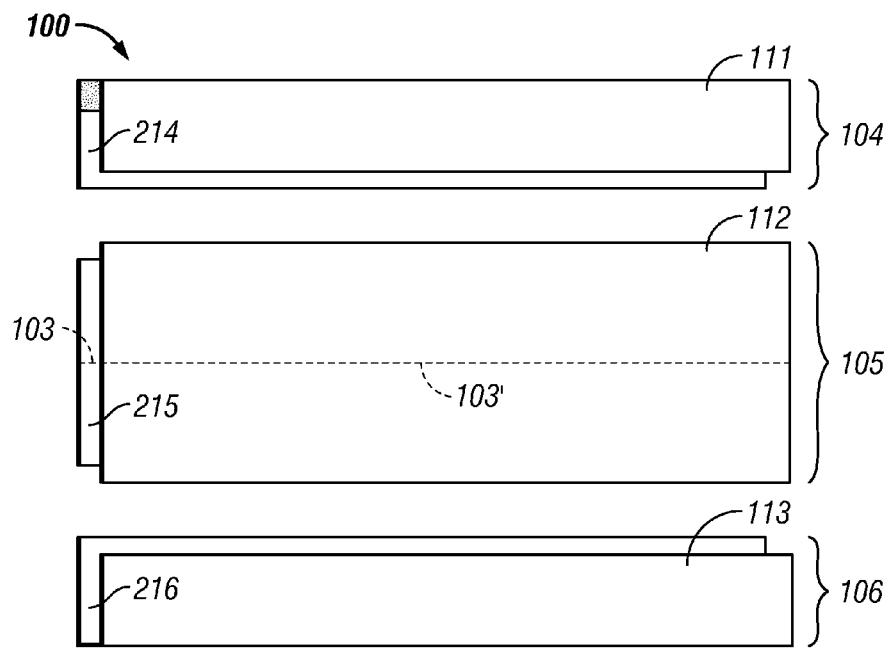
FIG. 2B illustrates an exploded plan view of a second side of a splice tape, in accordance with the disclosed embodiments.

FIGS. 2A and 2B illustrate exploded plan views of the tape side and protective paper side of the splice tape 100, respectively, in accordance with the disclosed embodiments. The slits 102, 102', 102" in the tape side are staggered with the slits 202', 202" in the protective paper 110 on the protective paper side of the splice tape 100. Slit 102 divides the stiffening strip 107 and the top of the first section of tape material 114. Slit 102' divides the bottom of the first section of tape material 114, also known as the "cover tape section", and the top of the second section of tape material 115. Slit 102" divides the bottom of the second section of tape material 115 and the top of the third section of tape material 116, also known as the "component carrier reel section". Slit 202' divides the bottom of the first section of protective paper 111 from the top of the second section of protective paper 112. Slit 202" divides the bottom of the second section of protective paper 112 from the top of the third section of protective paper 113. This staggered slit arrangement allows the proper alignment, tape adhesion, and removal of the protective paper 110 from the tape side covered with the adhesive composition 209 when the splice tape 100 adheres to component carrier reels.

The staggered slit arrangement of the splice tape 100 further aids in adhering each tape section 114, 115, 116 and protective paper section 111, 112, 113 to each other to form complete sections 104, 105, 106 of tape adhered to protection paper. The first complete section 104 of the splice tape 100 comprises the stiffening strip 107, a first section of tape material 114, a first section of tape material with adhesive 214, and a first section of protective paper 111. The first section of protective paper 111 slightly extends past one side of the first section of tape material 114. The bottom of the first section of tape material 114 extends past the bottom edge of the first section of protective paper 111. Therefore, the bottom edge of the first section of tape material 214 adheres to the top portion of the second section of protective paper 112.

The second complete section 105 of the splice tape 100 comprises a second section of tape material 115, a second section of tape material with adhesive 215, a fold line 103, 103', and a second section of protective paper 112. The second section of protective paper 112 slightly extends past three sides (the top edge, the first side edge, and the bottom edge) of the second section of tape material 115. The second side edge of the second section of tape material 115 extends past the edge of the second section of protective paper 112. Therefore, the top edge of the third section of tape material 216 adheres to the bottom portion of the second section of protective paper 112, and the bottom edge of the first section of tape material 214 adheres to the top portion of the second section of protective paper 112.

The third complete section 106 of the splice tape 100 comprises a third section of tape material 116, a third section of tape material with adhesive 216, and a third section of protective paper 113. The third section of protective paper 113 slightly extends past one side of the third section of tape material 116. The top of the third section of tape material 116 extends past the top edge of the third section of protective paper 113. Therefore, the bottom edge of the first section of tape material 214 adheres to the top portion of the second section of protective paper 112. The top edge of the third section of tape material 216 then adheres to the bottom portion of the second section of protective paper 112.

Figure 3:
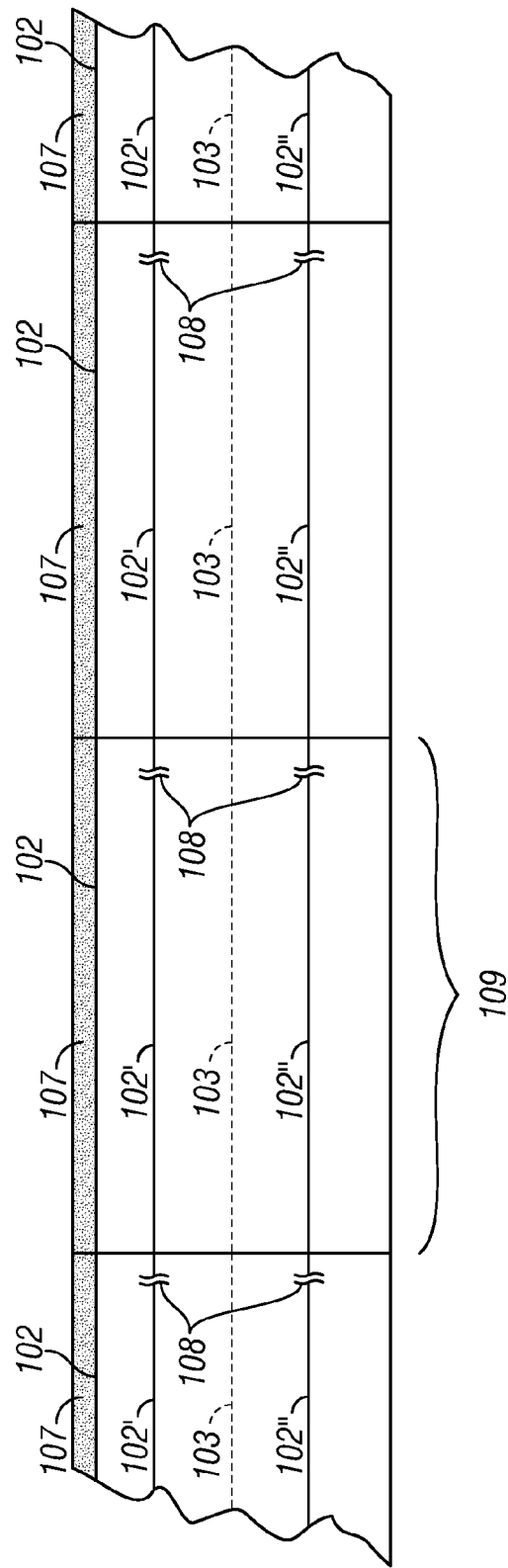
FIG. 3 illustrates a plan view of multiple units of splice tape, in accordance with the disclosed embodiments.

FIG. 3 illustrates a graphical representation of several units of splice tape 100 connected in a roll of splice tape, in accordance with the disclosed embodiments. The protective paper 110 in FIG. 1A adheres to the tape material with the adhesive composition 209 of FIG. 1B to form infinite units of splice tape 100 dispensed either from a roll or another dispensing mechanism. The desired units of splice tape 100 can be removed from a roll of multiple sections of splice tape 100, as shown in FIG. 3.

The application of the splice tape 100 to form a strong, yet flexible, joint between component carrier reels is described in FIGS. 4 to 14. It is understood that an 8 mm exemplary component carrier reel is illustrated in FIGS. 4 to 14. The disclosed splice tape may be used on any size component carrier reel and is not limited only to 8 mm component carrier reels. It is further understood that FIGS. 4 to 14 illustrate an exemplary, manual method for applying the splice tape to component carrier reels. The disclosed splice tape may be applied in either a manual, semi-automated, or automated manner, and is not limited to any one of these particular methods of use or application. FIGS. 15-21 illustrate an exemplary method of applying the disclosed splicing tape to connect component carrier reels using a fixture to align the reels for splicing, in accordance with the disclosed embodiments. A hand or cart mounted tool could be developed where an operator cuts and preps the ends of the component carrier reels, and places the ends of the reels in a similar fixture. Using rolls of disclosed splice tape 100, an automated system using, such as, for example, a label application-type machine, could apply the splice tape to the top and bottoms of the component carrier reels as disclosed herein. Either an automated or manual system could ensure the splice tape 100 is properly adhered to the component carrier reels and dispose of the removed portion of folded splice tape 100. It is understood that component carrier reels can carry any number or combination of different components such as electrical components, including resistors, capacitors, or IC's, or a mechanical component, such as a screw, or any combination of components.

Figure 4:
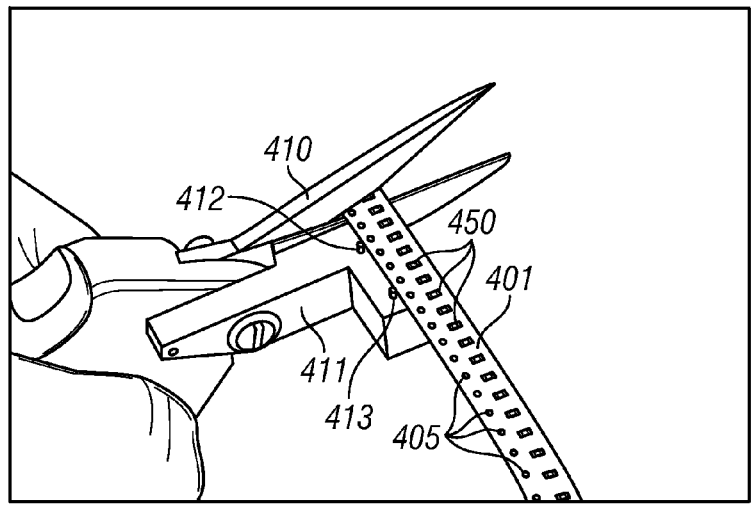
FIGS. 4 to 14 illustrate graphical representations of the application of the splice tape to component carrier reels, in accordance with the disclosed embodiments.

FIG. 4 illustrates an exemplary mandrel 411 for cutting and aligning the component carrier reels 401, 402 to be aligned using the splice tape 100, in accordance with the disclosed embodiments. The mandrel 411 is attached to a pair of scissors 410, or any other type of manual or automated cutting or trimming device. The mandrel 411 attached to a pair of scissors 410 works for trimming all sizes of component carrier reels 401, 402. Both ends of the component carrier reels 401, 402 are aligned using alignment pins 412, 413 in the appropriate locations on the mandrel 411 attached to a pair of scissors 410. The alignment pins 412, 413 can also be sized to receive the feeder holes 405 of the component carrier reels 401, 402 for further alignment. The scissors 410 then trim the ends of the component carrier reels 401, 402 to the appropriate size to form a proper connection between reels 401, 402.

Figure 5:
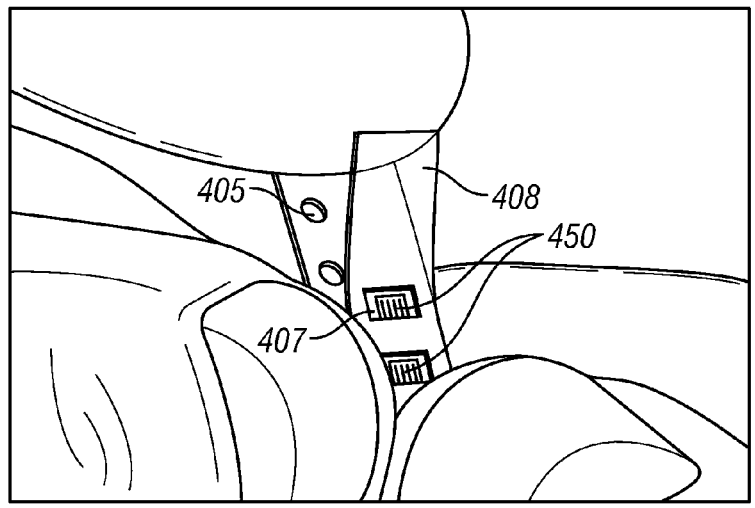

As illustrated in FIG. 5, the top cover tape 408 of the component carrier reels 401, 402, can be lifted before trimming the reels 401, 402 using the mandrel 411 attached to a pair of scissors 410, in accordance with the disclosed embodiments. The cover tape 408 is used to hold components 450 in place within the component pockets 407 of the component carrier reels 401, 402. It is understood that the exemplary mandrel 411 attached to a pair of scissors 410 is a non-limiting example of one method of cutting component carrier reels 401, 402 to size. This process can be performed either manually, in a semi-automated fashion, or fully automated fashion. The components 450 are exposed for picking and placing by removing the top cover tape 408 and any attached splice tape 100. The attached splice tape 100 does not interfere with either feeding through machinery or removal of the top cover tape 408. Component carrier reels 401 402 usually have components 450 in the component pockets 407. Component pick and place machines (not illustrated) take component carrier reels 401, 402 loaded with components 450 within the component pockets 407, pull the cover tape 408 off, and pick components 450 out of the pockets 407. The pick and place machine then places the components 450 onto circuit boards for use in electronic equipment, or any other type of device.

Figure 6:
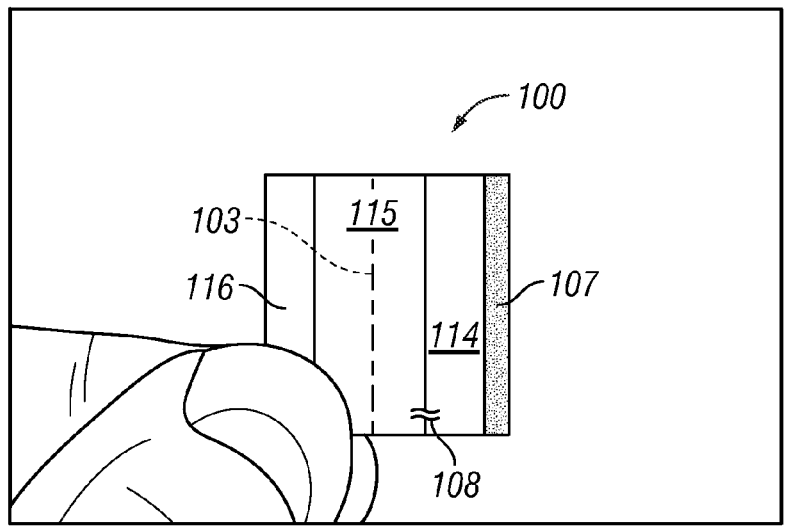

FIG. 6 illustrates a single unit of splice tape 100 for application to component carrier reels 401, 402, in accordance with the disclosed embodiments. The single unit of splice tape 100 is comprised of the stiffening strip 107, first section of tape material 114, the second section of tape material 115, the third section of tape material 116. A fold line 103 bisects the second section of tape material 115 and guides folding the splice tape 100 around a component carrier reel. Notches 108 help hold sections 107, 114, 115, and 116 together before application to a reel.

Figure 7:
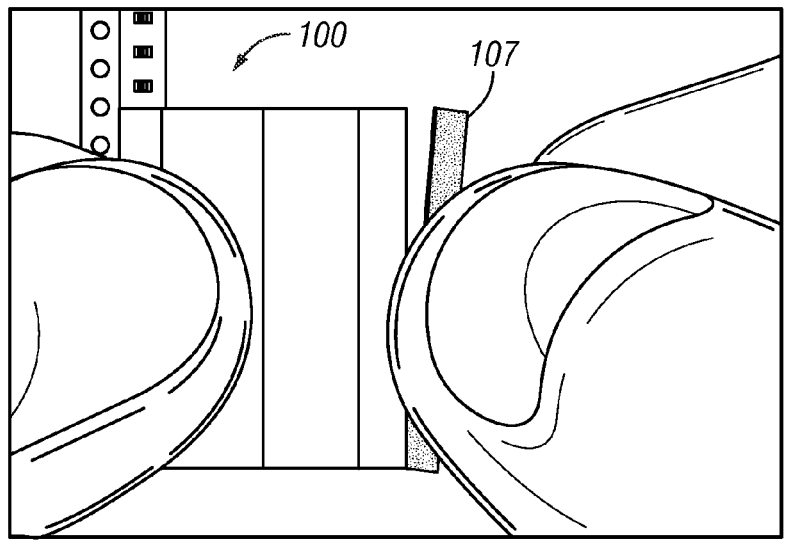

FIG. 7 illustrates an optional removal of stiffening strip 107 for placement on smaller component carrier reels, in accordance with the disclosed embodiments. Smaller component carrier reels, such as, for example, 4 mm reels, do not need an added stiffening strip to effectively secure the joint on the top tape sprocket feed hole side between component carrier reels as in the location of 107 above the component carrier feed holes.

Figure 8:
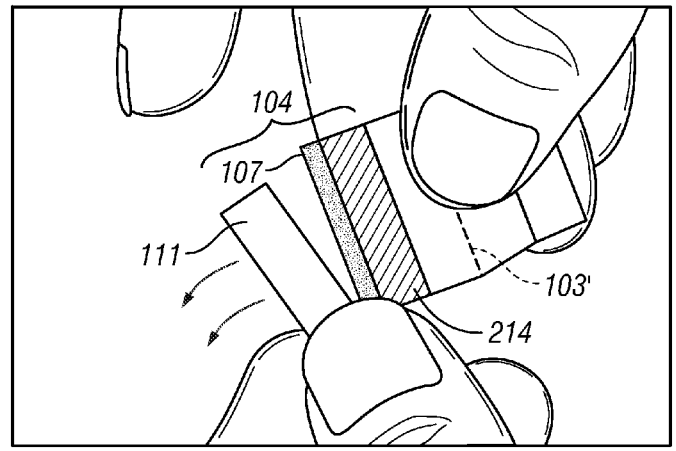
Figure 9:
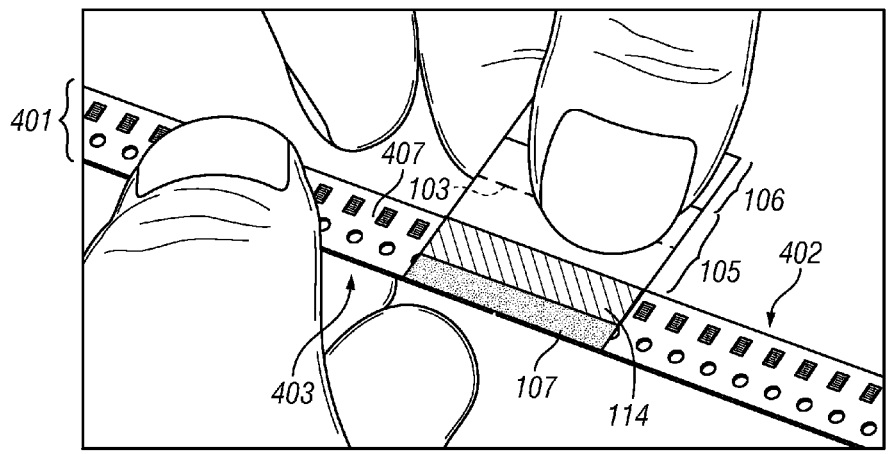
Figure 10:
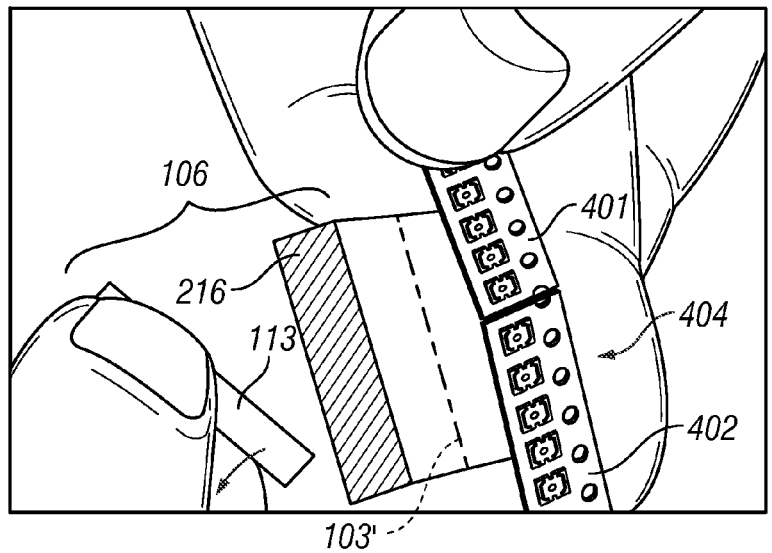
Figure 11:
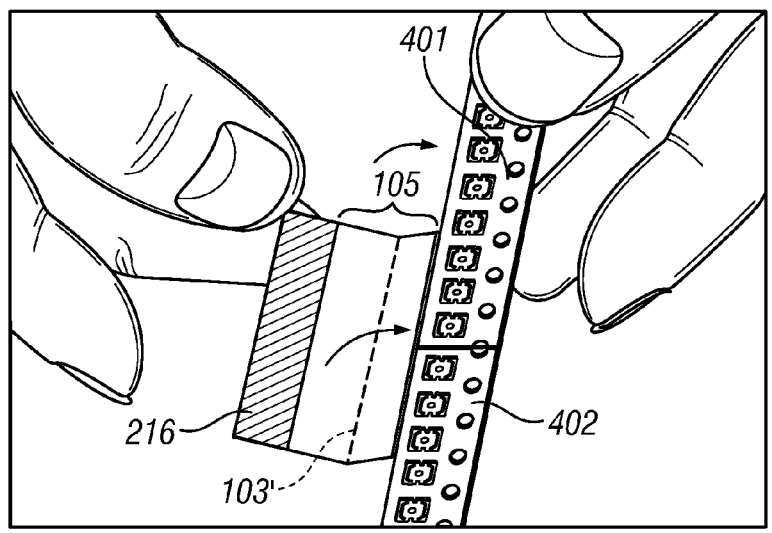
Figure 12:
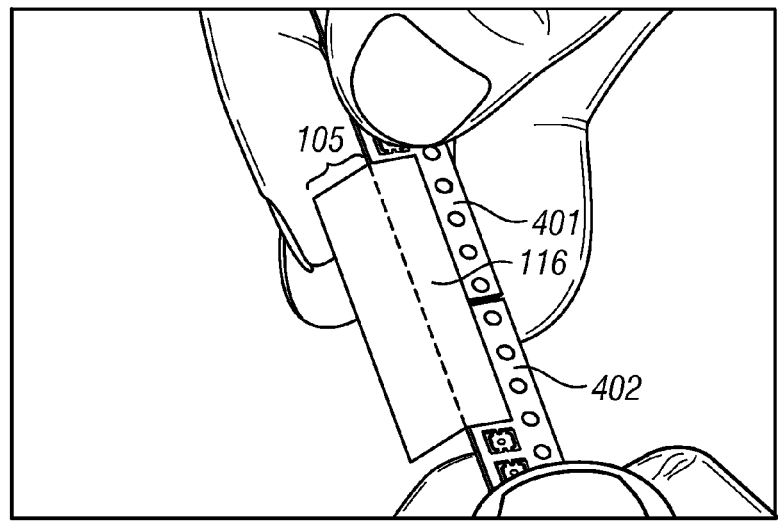

In FIG. 8, the first section of protective paper 111 is removed from first section 104 of the splice tape 100, thus exposing the adhesive side 214. In FIG. 9, a first section of tape material 114 and the stiffening strip 107 are adhered to the top side 403 of component carrier reels 401, 402, thus covering a portion of the top cover tape 408 on top of component wells 407. In FIG. 10, the component carrier reels 401, 402 are flipped over to the underside 404. The third section of protective paper 113 is then removed from the third complete section of tape material 106 to expose a third section of tape material with adhesive 216. In FIG. 11, the third section of tape material with adhesive 216 and the portion of the middle section 105 of splice tape above the fold line 103' is folded towards the underside 404 of the component carrier reels 401, 402. In FIG. 12, the third section of tape material 116 is adhered to the underside 404 of the component carrier reels 401, 402, thus forming a strong, yet flexible joint between reels 401, 402. The adhered third section 116 of splice tape 100 covers the exterior portion 406 of the component pockets 407, but does not cover or interfere with the feeder holes 405 of the component carrier reels 401, 402. The spliced component carrier reels therefore easily feed through machines adding components at a later time.

Figure 13:
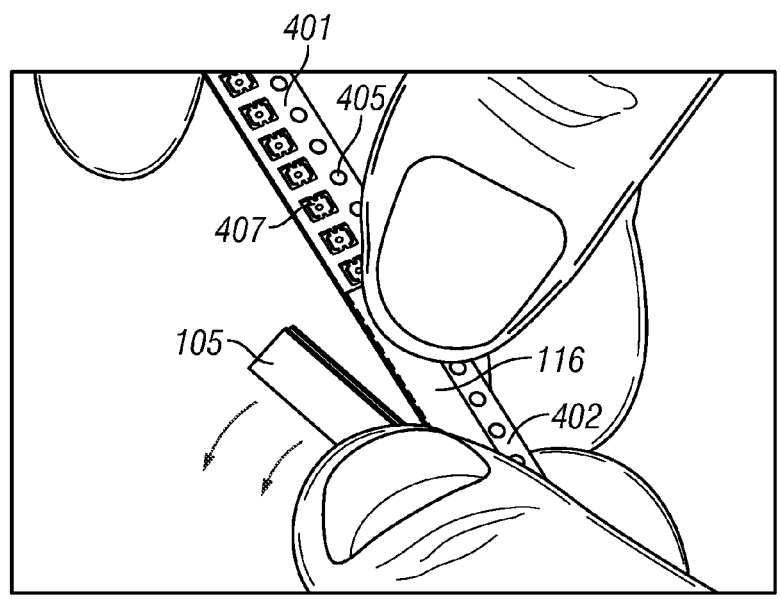
Figure 14:
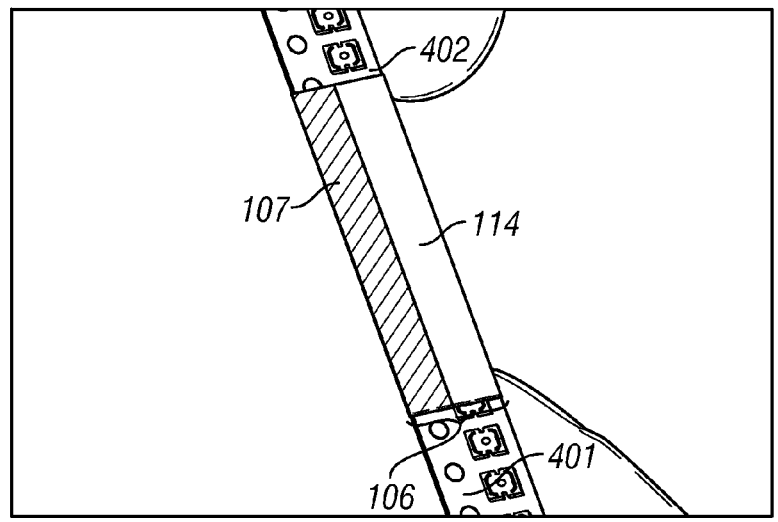

In FIG. 13, the folded second section 105 of splice tape 100 is removed, along with the second section of protective paper 112 still attached to the adhesive 215 on the second section 105 of splice tape. The folded second section 105 of splice tape 100 hanging off the component carrier reels 401, 402 is easily removed from the spliced reel joint by a shearing movement. The removal of complete tape section 105 does not cause a static shock that may damage components 450. FIG. 14 illustrates the completed, spliced component carrier reels 401, 402 with the attached splice tape 100, showing adhered tape sections 107 and 114.

Figure 15:
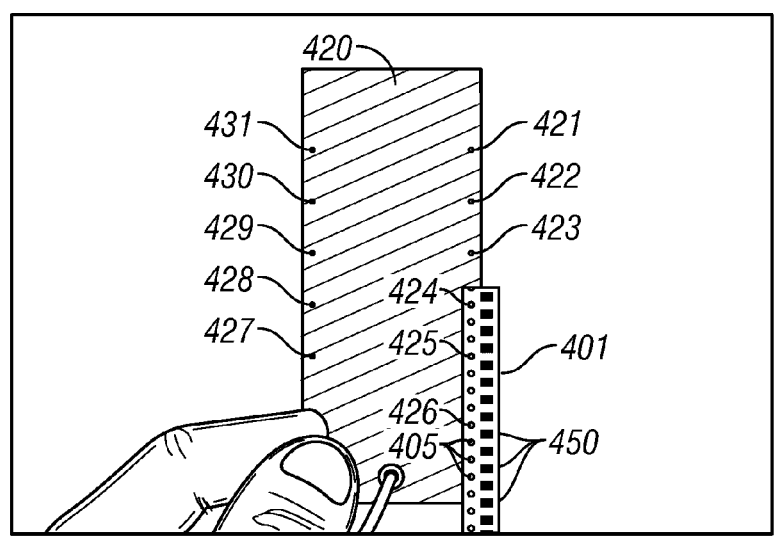
FIGS. 15 to 21 illustrate graphical representations of the application of the splice tape to component carrier reels using an alignment fixture, in accordance with the disclosed embodiments.
Figure 16:
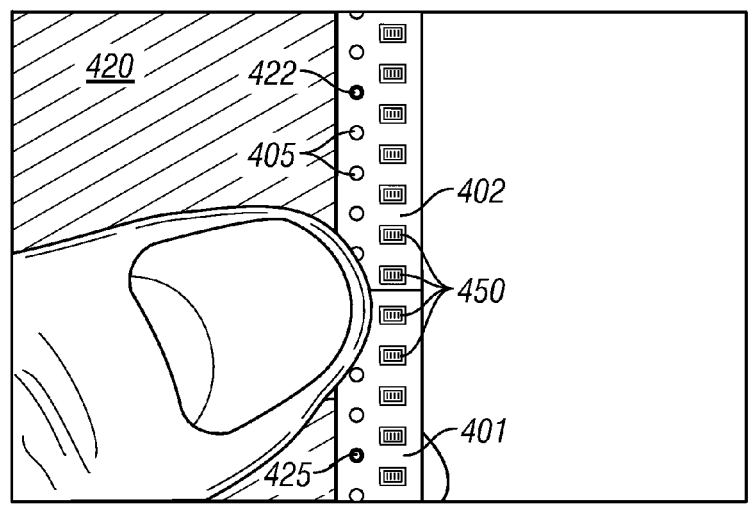

FIGS. 15-21 illustrate an exemplary method of applying the disclosed splicing tape 100 to component carrier reels using an alignment fixture 420 to align the component carrier reels 401, 402 for splicing, in accordance with the disclosed embodiments. In FIG. 15, a component carrier reel 401 is aligned on an exemplary alignment fixture 420 to aid in alignment of component carrier reels 401, 402. Alignment fixture 420 can be comprised of any type of stiff material, such as, for example plastic or metal. The feeder holes 405 of component carrier reel 401 can be aligned on the alignment fixture 420 using any number of alignment pins 421 to 431 that outwardly extend from the alignment fixture 420. Alignment pins 421 to 431 can be sized to receive any size feeder holes 405 of any size component carrier reel 401. Feeder holes 405 of component carrier reel 401 are aligned on alignment pins 424, 425, 426 in FIG. 15. Alignment pins 421, 422, 423 are sized to receive and fit feeder holes 405 on component carrier reel 402. When aligned using the alignment fixture 420, component carrier reels 401, 402 laterally align to form a joint, as illustrated in FIG. 16.

Figure 17:
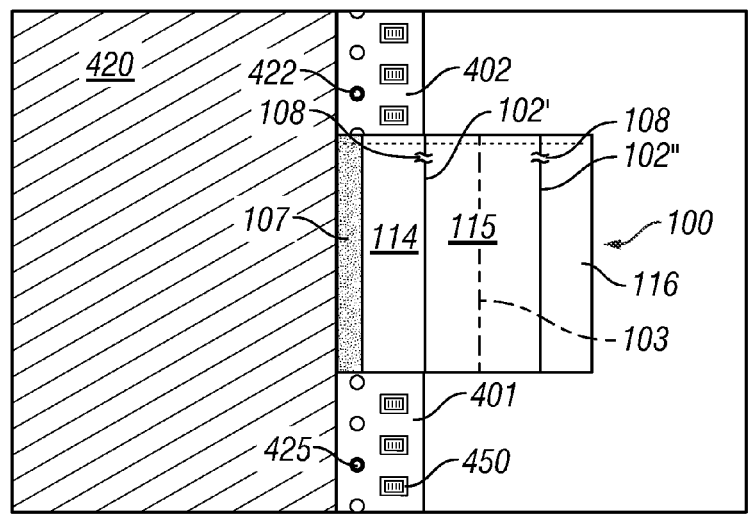

FIG. 17 illustrates adhesion of splice tape 100 to component carrier reels 401, 402 using an alignment fixture 420, in accordance with the disclosed embodiments. The first section of protective paper 111 is first removed from the back of the supporting strip 107 and the first tape section 114 to expose its adhesive side 214. The adhesive side of the supporting strip 107 is adhered over the feeder holes 405 of the joint of the component carrier reels 401, 402. The adhesive side 214 of the first tape section 114 is adhered on top cover tape 408 of the component carrier reels 401, 402. Therefore the slit 102' is aligned in a parallel manner with the edge of the component carrier reels 401, 402.

Figure 18:
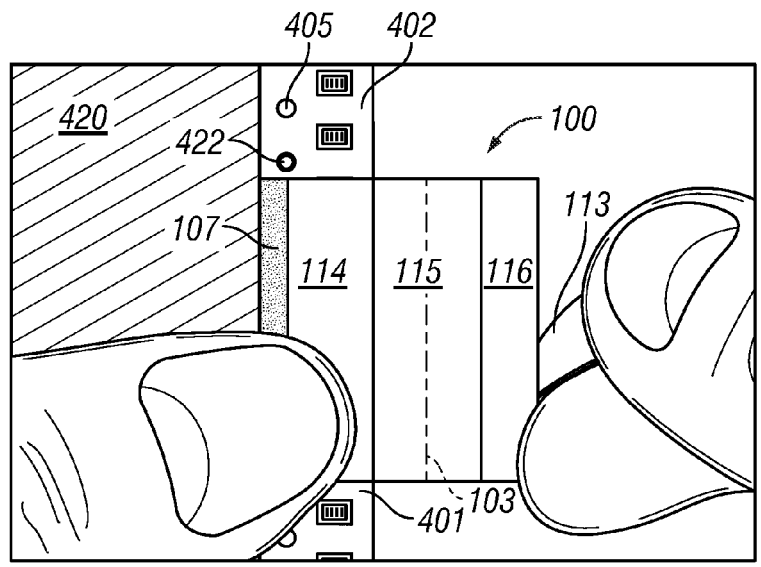
Figure 19:
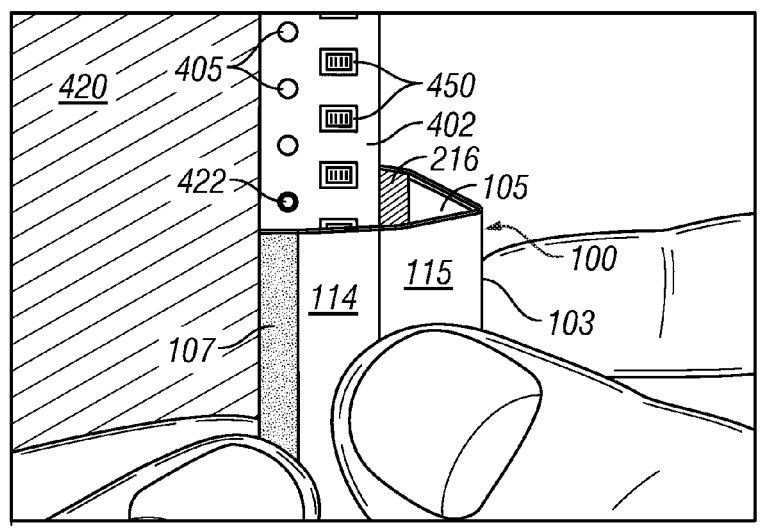
Figure 20:
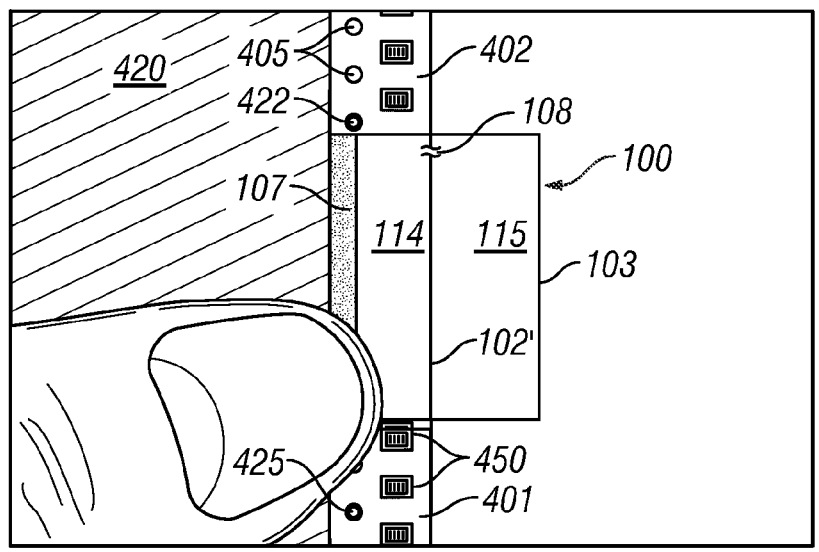

In FIG. 18, the third section of protective paper 113 is then removed from the back of the third section 116 of splice tape 100 to expose the adhesive side 216 (not shown). Thereafter third tape section 116 is folded towards the bottom side of the competent carrier reels 401, 402, as shown in FIG. 19. The splice tape folds in half at the fold line 103 that bisects section 115. In FIG. 20, the adhesive side 216 of splice tape 100 section 116 is then adhered to the back portion of the component carrier reels 401, 402. The alignment fixture 420 does not interfere with adhesion of the splice tape 100, but rather aid in alignment to form an accurate joint between reels 401, 402.

Figure 21:
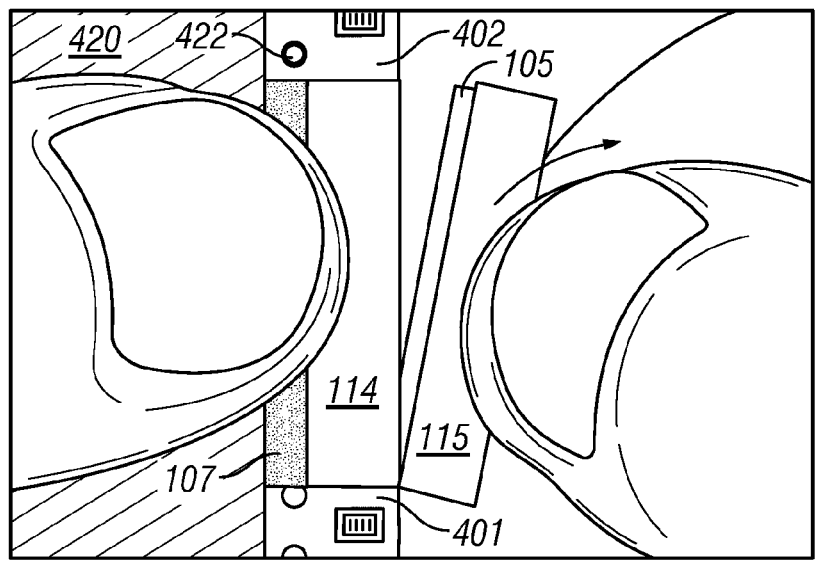
Figure 22:
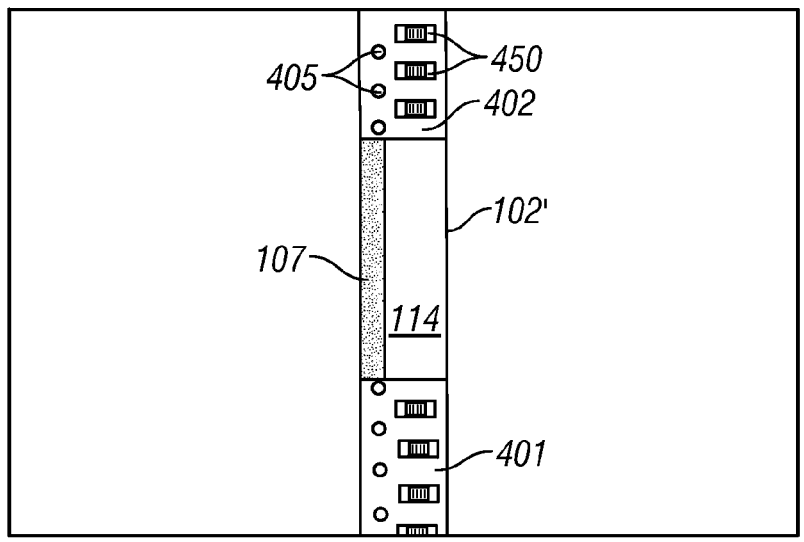
FIG. 22 illustrates a graphical representation of an exemplary spliced 8 mm component carrier reels, in accordance with the disclosed embodiments.

The second complete section 105 of the splice tape 100 is then pulled away from the adhered sections 107, 114, and 116, as illustrated in FIG. 21. The second complete section 105 of the splice tape 100 shears from adhered sections 114 and 116 at slits 102' and 102", respectively. The second protective paper 112 is still attached to the back of second tape section 115. In FIG. 22, the component carrier reels 401, 402 have been removed from the alignment fixture 420 and are ready for feeding through component pick and place machinery (not illustrated).

Figure 23:
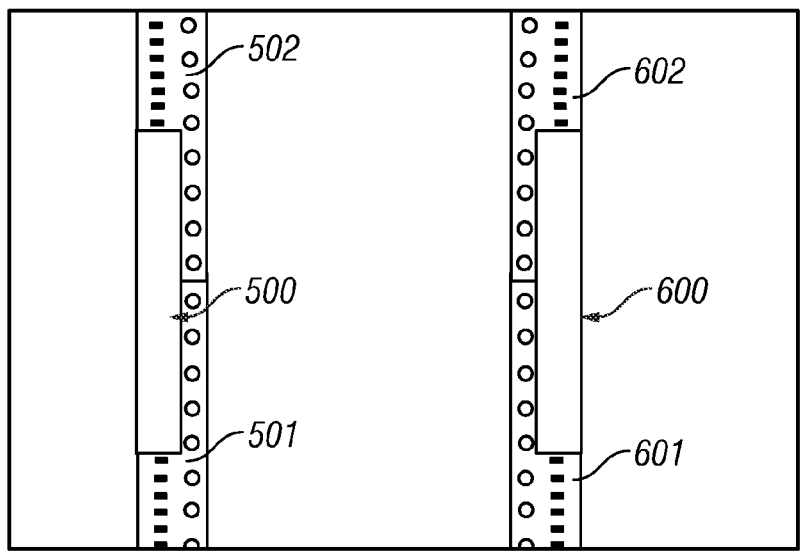
FIG. 23 illustrates a graphical representation of exemplary spliced 4 mm component carrier reels, in accordance with the disclosed embodiments.
Figure 24:
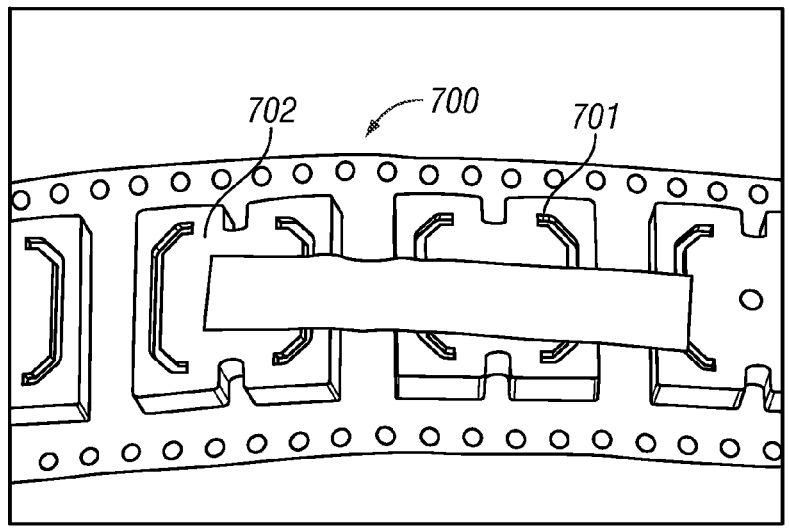
FIGS. 24 and 25 illustrate a graphical representation of exemplary spliced 24 mm component carrier reels, in accordance with the disclosed embodiments.
Figure 25:
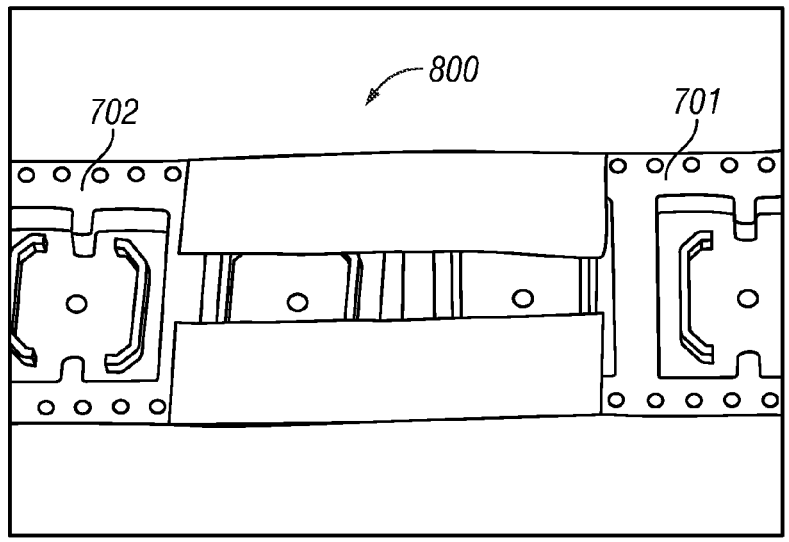

FIGS. 23-25 illustrate graphical representations of exemplary component carrier reels 501, 502, 601, 602, 701, 702, in accordance with the disclosed embodiments. It is understood that the space tape disclosed herein is not limited to any particular size or dimensions. It is further understood that any size component carrier reel can be connected using the disclosed splice tape. In FIG. 23, splice tape 500 is applied to the underside, or "pocket side" of component carrier reels 501, 502 in accordance with the disclosed embodiments described in FIGS. 4 to 21. For use on smaller component carrier reels, such as the exemplary 4 mm reel 501, 502, the metalized supporting strip 107 can either be used to connect the reels 501, 502 or removed to allow attachment in accordance with the embodiments disclosed in FIGS. 4 to 21. On the cover tape side, a non-metalized tape 600 is used to connect the ends of the component carrier reels 601, 602. The 4 mm component carrier reels are exemplary reels showing application of the disclosed splice tape 100 on smaller component carrier reels and is not solely limited to application on the 4 mm reels.

FIGS. 24 and 25 illustrate the application of the splice tape 700, 800 on 24 mm component carrier reels 701, 702, in accordance with the disclosed embodiments. Splice tape 800 is applied twice using the steps described in FIGS. 4-21. The 24 mm component carrier reels are exemplary reels showing application of the disclosed splice tape 100 on larger component carrier reels and is not solely limited to application on the 24 mm reels. For larger component carrier reels 701 702, additional support for the component carrier reel joint may be needed. The disclosed splice tape is applied as described in FIGS. 4 to 21 on both sides of the 24 mm component carrier reels 701, 702. Further support may be added using an additional portion of splice tape 700 on the bottom side of the component carrier reel.

It will be appreciated that variations of the above-disclosed and other features and functions, or alternatives thereof, may be desirably combined into many other different systems or applications. Furthermore, various presently unforeseen or unanticipated alternatives, modifications, variations or improvements therein may be subsequently made by those skilled in the art, which are also intended to be encompassed by the following claims.

What is claimed is:

1. A splice tape, comprising:
a single unit of splice tape comprising a plurality of staggered sections;
a protective paper covering an adhesive composition applied to one side of said single unit of splice tape;
a staggered slit arrangement of said single unit of splice tape and said protective paper, wherein said plurality of staggered sections of said single unit of splice tape further comprise a first tape section, a second tape section, and a third tape section, and said staggered sections of said protective paper comprise a protective paper of a first section, a protective paper of a second section, and a protective paper of a third section;
wherein said protective paper of said second section overlaps said first tape section and said third tape section; and
wherein said second tape section comprises a fold line bisecting said single unit of splice tape and said protective paper of said second section is not removed from said second tape section of said single unit of splice tape.

2. The splice tape of claim 1 wherein said splice tape splices a component carrier reel joint comprising a first component carrier reel laterally aligned with a second component carrier reel.

3. The splice tape of claim 2 further comprising a sensing stiffening strip integrated in said first tape section of said single unit of said splice tape and adhered to said component carrier reel joint to prevent said component carrier reel joint from moving either axially or laterally.

4. The splice tape of claim 3 wherein said sensing stiffening strip comprises a metal material, wherein said metal material comprises at least one of brass and bronze.

5. The splice tape of claim 1 wherein said single unit of said splice tape comprises a flexible plastic material wherein said plastic material comprises polyester.

6. The splice tape of claim 1 wherein:
notches between said first tape section, said second tape section, and said third tape section connect said sections.

7. The splice tape of claim 6 wherein:
said first tape section adheres to an offset of said protective paper of said first section;
said second tape section adheres to an offset of said protective paper of said second section; and
said third tape section adheres to an offset of said protective paper of said third section.

8. A stiffened splice tape, comprising:
a single unit of splice tape comprising a plurality of staggered sections;
  a protective paper covering an adhesive composition applied to one side of said single unit of splice tape;
  a staggered slit arrangement of said single unit of splice tape and said protective paper, wherein said staggered slit arrangement in said single unit of splice tape creates a first tape section, a second tape section, and third tape section; and
  said staggered slit arrangement in said protective paper creates a first protective paper section, a second protective paper section, and third protective paper section;
  wherein said second protective paper section overlaps said first tape section and said third tape section, wherein said first tape section overlaps said second protective paper section, wherein said third tape section overlaps said second protective paper section;
  wherein said second tape section comprises a fold line bisecting said single unit of splice tape and said protective paper of said second section is not removed from said second section of said splice tape unit; and
  a sensing stiffening strip attached to said first section of said tape unit.

9. The stiffened splice tape of claim 8 wherein;
said first tape section adheres to an offset of said first protective paper section;
said second tape section adheres to an offset of said second protective paper section; and
said third tape section adheres to an offset of said third protective paper section.

10. The splice tape of claim 8 wherein said stiffening strip comprises polyester or a malleable metal material, wherein said malleable metal material comprises at least one of the following: brass, copper, or bronze.

\* \* \* \* \*